United States Patent [19]

Fisk

[11] Patent Number: 5,274,643
[45] Date of Patent: Dec. 28, 1993

[54] METHOD FOR OPTIMIZING A NETWORK HAVING VIRTUAL CIRCUIT ROUTING OVER VIRTUAL PATHS

[75] Inventor: Benjamin W. Fisk, Campbell, Calif.

[73] Assignee: Stratacom, Inc., San Jose, Calif.

[21] Appl. No.: 989,093

[22] Filed: Dec. 11, 1992

[51] Int. Cl.⁵ .............................................. H04J 3/26
[52] U.S. Cl. .................................... 370/94.1; 370/60;
370/95.1; 340/825.03
[58] Field of Search ............... 370/54, 94.1, 94.3,
370/60, 60.1, 17, 13.1, 112, 94.2, 95.1, 118;
379/221, 207; 340/825.52, 825.03, 826, 827;
395/800

[56] References Cited

PUBLICATIONS

John T. Mulqueen, "Network-Modeling Tools Cut Costs", *Communications Week*, Aug. 10, 1992, pp. 1,54.
The *IPX Product Family System Description*, (1990 StrataCom, Inc.).

Primary Examiner—Douglas W. Olms
Assistant Examiner—Huy Vu
Attorney, Agent, or Firm—Blakely Taylor Sokoloff & Zafman

[57] ABSTRACT

Virtual circuits are routed and grouped into virtual paths during an interactive topology design process. Virtual circuits are assigned to virtual paths that provide minimum cost to each pass through a topology design. Virtual paths are dispersed into subgroups that minimize bandwidth consumption and maximize routing flexibility. This topology optimization process is constrained to minimize use of network resources.

17 Claims, 7 Drawing Sheets

METHOD FOR OPTIMIZING A NETWORK HAVING VIRTUAL CIRCUIT ROUTING OVER VIRTUAL PATHS

FIELD OF THE INVENTION

The system of the present invention relates to design topology. In particular, the system of the present invention relates to the design of telecommunication networks.

ART BACKGROUND

Networks route voice and data information around the world. Different types of networks are used for different types of environments and requirements and networks are often interconnected to provide internetwork communication. Three types of networks are the most common. A broadband or broadcast network covers a wide area. A metropolitan area network covers a smaller region. Local area networks are used in a limited distance environment such as an office or business.

As the telecommunications equipment that operates the network increases in sophistication and in complexity and capacity, and further, as the use of the networks increase and the number of the networks increase, the complexity of designing a network increases. The complexity of designing a network has resulted in the development of design tools to assist a network designer in designing a network. Typically a customer of a telecommunication equipment manufacturer or distributor will come to the telecommunication company with certain system requirements referred to as the customer's traffic demand for the network. The network designer develops a network of equipment having certain capabilities and features to be located at predetermined locations to form a network which meets the customer's requirements. The capability of the network designer may reflect on the cost of setting up and operating the network. A well designed network may be cheaper to purchase as well as cheaper to operate. Furthermore, proper specification of the network will also minimize the frequency of failed connections during routing while maximizing use of the network. The design of telecommunication networks is a science in itself and several books have been written on the subject including, Roshan L. Sharma, *Network Topology Optimization, the Art and Science of Network Design* (van Nostrand Reinholt, 1990). See also, Andrew S. Tanenbaum, *Computer Networks*, Second Edition (Prentice-Hall 1989).

It is apparent that as the technology of the telecomunication equipment changes, so do the rules for designing an optimum network. In particular telecommunications manufacturer StrataCom, Inc. of San Jose, Calif., has developed network communications modules, referred to as IPX TM modules (IPX is trademark of StrataCom, Inc.) that groups point to point connections referred to as "virtual circuits," having like characteristics. These groups of virtual circuits are referred to as "virtual paths." The virtual paths increase the capacity of the node from 256 to 1,024 virtual circuits. The nodes having the virtual path capability can group a predetermined number of virtual circuits into virtual paths, up to the maximum number of virtual paths of the node. By increasing the virtual circuit capacity at each node, the number of nodes required in the network is dramatically decreased.

The network optimization and design tools available, however, do not provide for grouping of virtual circuits into virtual paths and therefore, any network topology generated from using these design tools will not be optimized. In particular, existing network topology design techniques provide for single routed virtual paths through the nodes. Therefore, a network designed using these techniques will over-specify the amount of equipment required. Furthermore, there is no apparent way to simply decrease the amount of equipment and nodes required because the design not only specifies the amount of equipment but also the location the equipment will be placed.

SUMMARY AND OBJECTS OF THE INVENTION

It is therefore an object of the present invention to provide a network design tool which takes into account the routing of virtual circuits over virtual paths.

It is an object of the present invention to provide a cost measure to evaluate the relative cost of grouping virtual circuits into virtual paths in a network optimization design process.

The system of the present invention provides a network design optimization tool which takes into account routing capability for routing of virtual circuits onto virtual paths. A connection cost is first determined. This unique cost measure is generated from the product of the minimum number of hops for a virtual circuit derived from the unconstrained routing of a point to point connection, and a measure of consumption of a link bandwidth for each point to point virtual circuit. Based on the cost measure, certain virtual circuits can be grouped into virtual paths to increase the virtual circuit capacity of each node. Once all virtual circuits are assigned to virtual paths, the routing and loading efficiency is maximized by distributing virtual paths into balanced sub-paths subject to node constraints. This system optimizes the effectiveness of the virtual path technology in a telecommunications network.

Other objects, features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements and in which.

DETAILED DESCRIPTION

Figure 1:
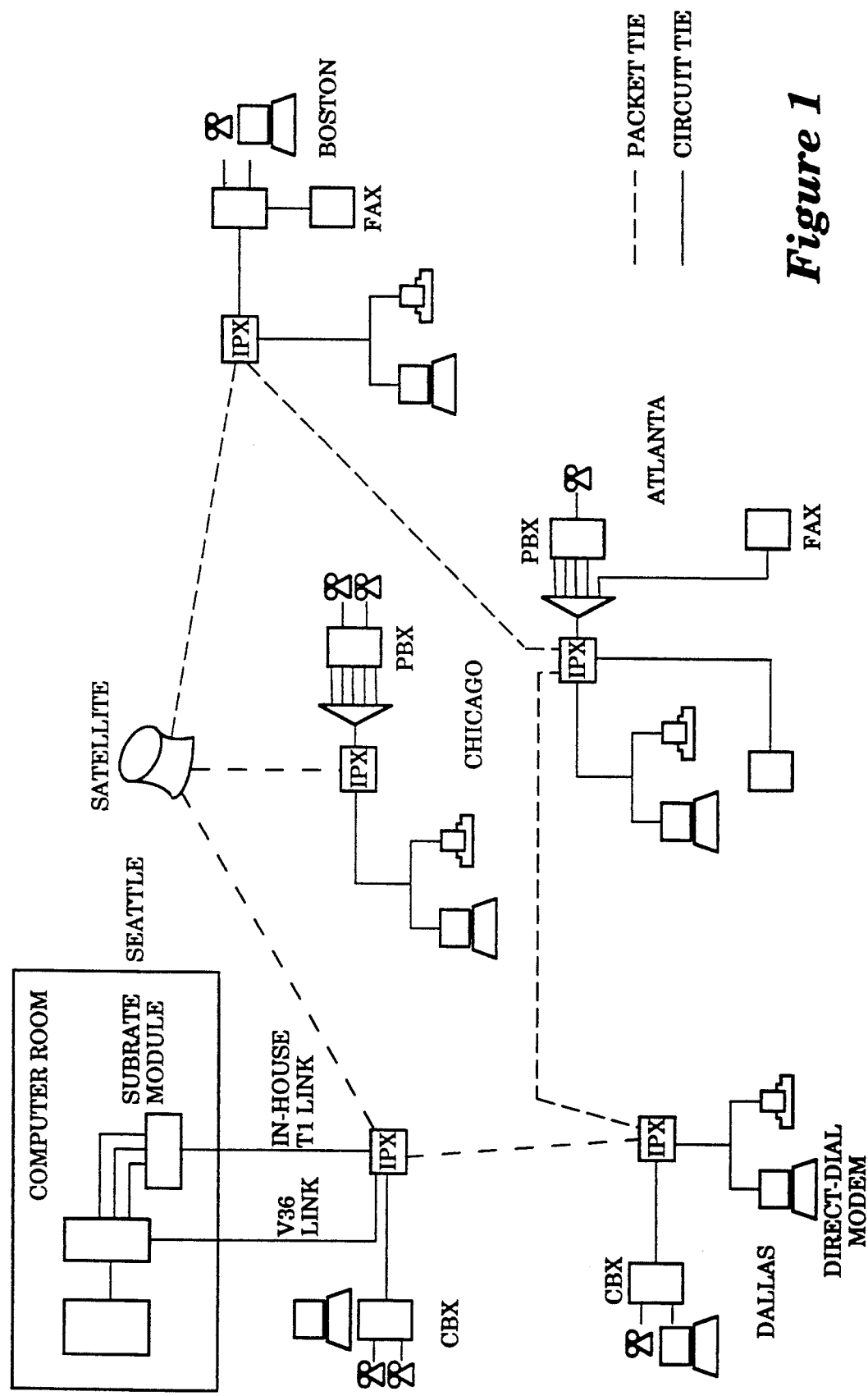
FIG. 1 shows a telecommunications network.

FIG. 1 illustrates an exemplary network topology of interconnected voice and data devices. The network discussed herein is a packet switched network that includes IPX TM modules (IPX is a trademark of StrataCom, Inc.) as nodes in the network. The IPX modules have the capability of placing point to point virtual circuits having like characteristics into groups or virtual paths to increase the number of concurrent virtual circuits at each node.

Figure 2:
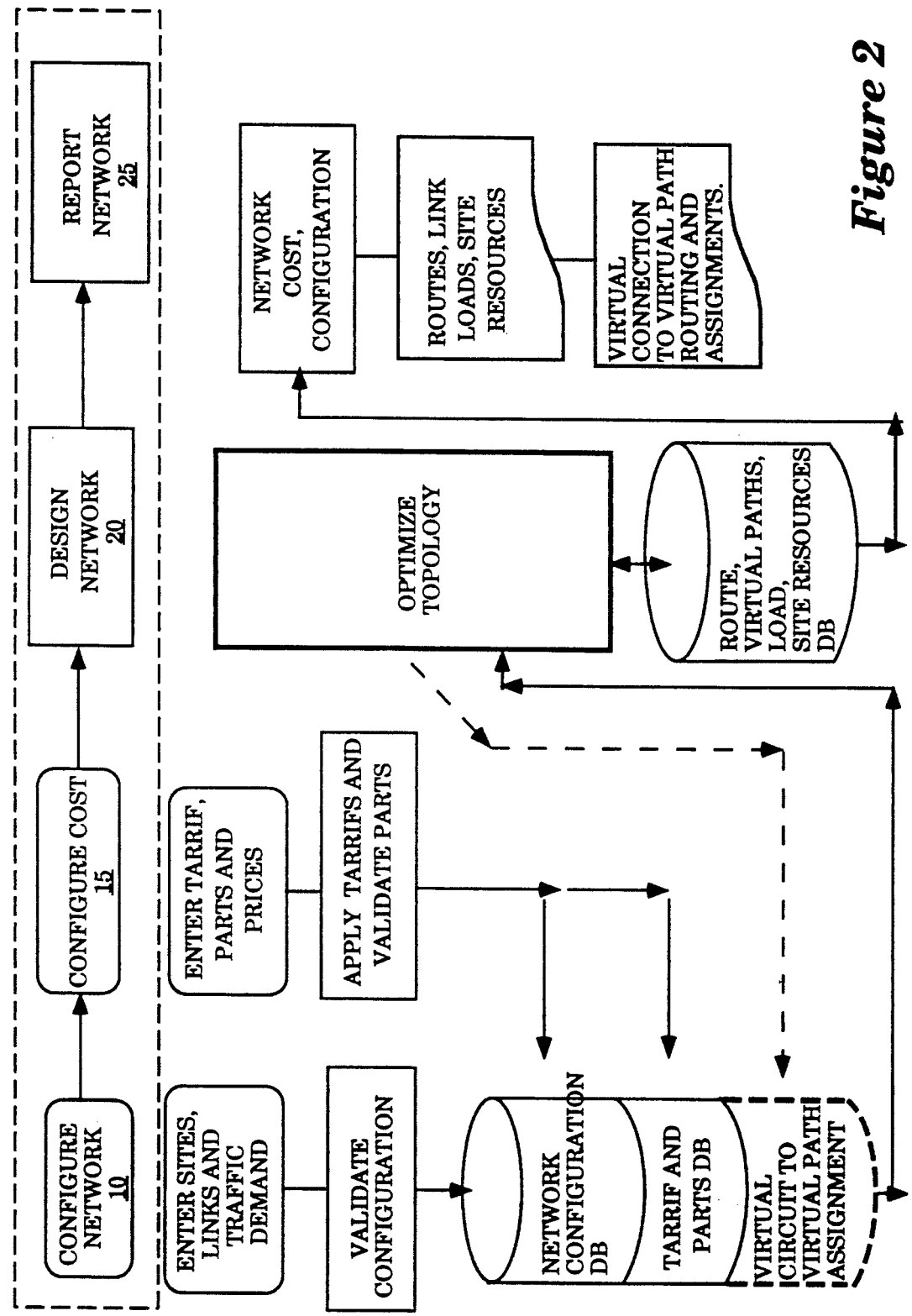
FIG. 2 is a flow chart that represents the process flow of an illustrative network design tool.

FIG. 2 is a flowchart illustration of the network design tool of one embodiment of the present invention that accommodates virtual circuit routing over virtual paths. A network is first configured according to customer specification, step 10. This includes information regarding location of customer sites, the type of data, the bandwidth required and the number of ports at each location. The cost for this initial configuration is then determined at step 15. To determine the cost such as that due to tariff, parts and other operation costs, a network configuration database, a tariff database and a parts database are accessed. Based on an initial configuration and cost, the network design tool is used to generate a first version of the network design at step 20. A network report which identifies the network cost configuration, the routes, link loads, site resources and other virtual circuits are then generated. This process, is executed over multiple iterations by a network designer an attempt to optimize the network design. The present design tool takes into account the routing of virtual circuits over virtual paths to optimize utilization of each node.

Figure 3:
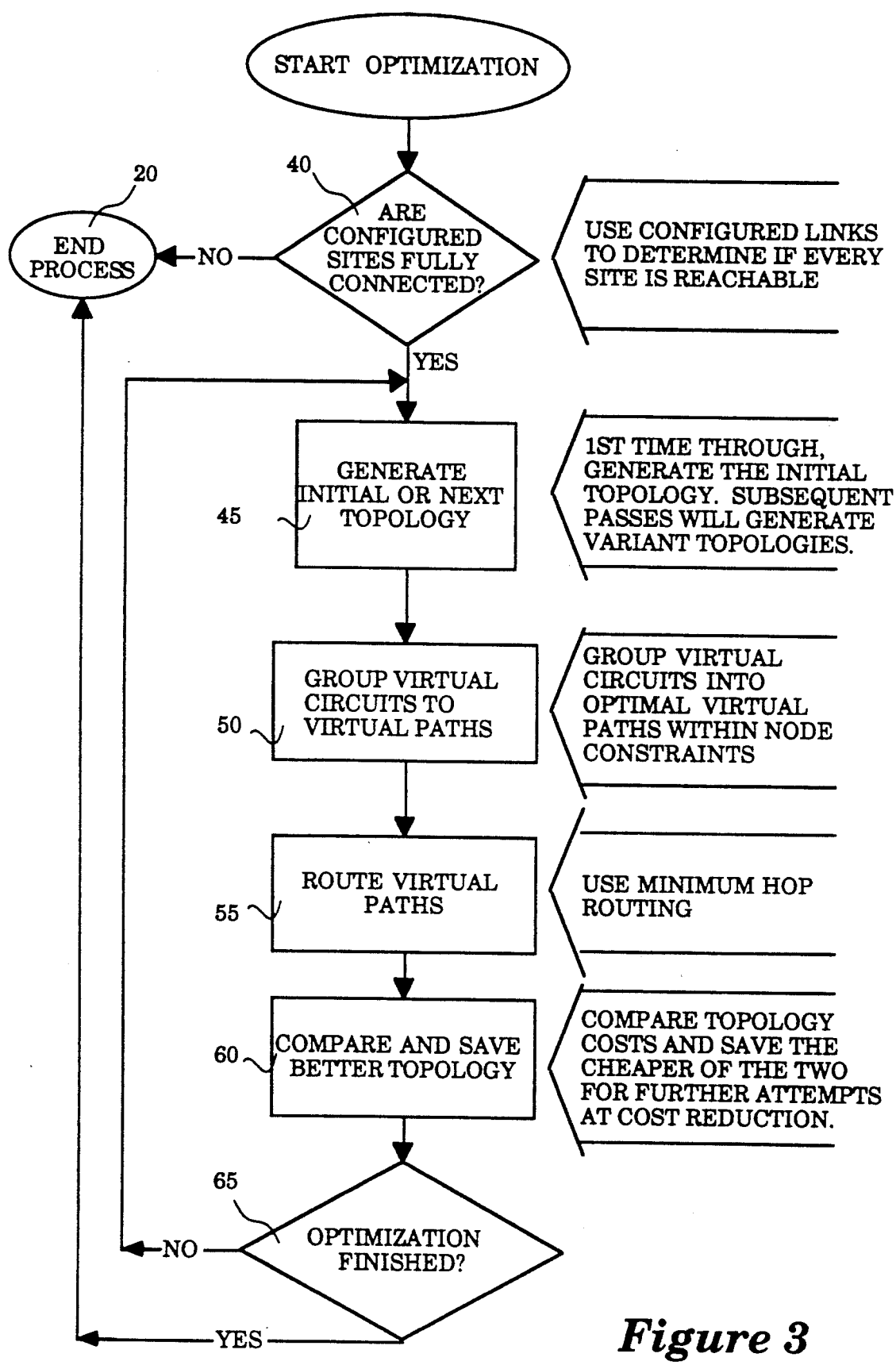
FIG. 3 is a flow diagram providing an overview of the topology optimization process.

FIG. 3 is a flow chart illustrative of the overview of the topology optimization process. A link, which is a transmission pipe between two nodes, is considered configured when the appropriate database elements have been entered to provide the design tool information as to how to connect the two nodes or the links. At step 40, the configured links are referenced to determine if each of the sites is reachable. At step 45 an initial network topology is generated. For subsequent iterations of the optimization process, subsequent versions of a topology are generated based on design considerations including costs of prior versions of network topologies.

At step 50, virtual circuits are grouped into virtual paths and at step 55 the virtual paths are routed, preferably utilizing the minimum number of hops or connections. For example, the virtual paths can be routed using a minimum hop routing module provided with the design tool. Shortest path routing algorithms for finding the minimum hop are well known in the art. (For information regarding routing algorithms see, Andrew Tannenbaum *Computer Networks*, 2nd Edition, (Prentice Hall 1989)).

At step 60 the costs of an implementation of the current version of the network topology are analyzed. The cost analysis provides some guidance to the network designer as to a next network topology to design and analyze in an attempt to determine an optimum network topology. Furthermore, the designer can compare the costs of the current topology and the previous topology and save the topology having the lower cost for subsequent reference. Subsequent topologies can then be generated based upon the lower cost topology. At step 65, if the network designer determines if the network is optimized or the network cost meets cost criteria indicative of an optimized network, the process is complete, step 70. Otherwise a next network topology is generated, step 45, and the process continues until an optimized network topology is designed.

Figure 4:
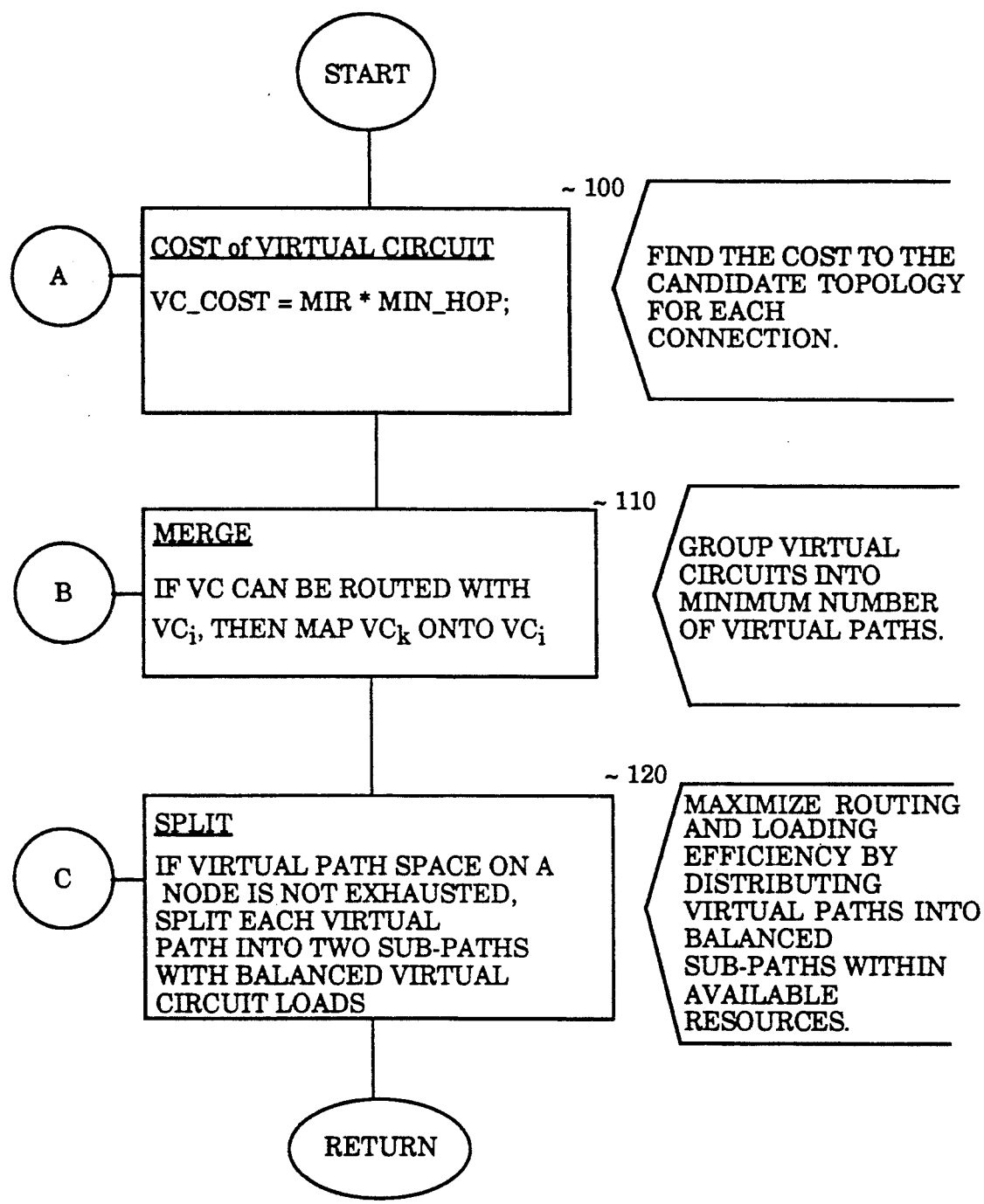
FIG. 4 is a flow diagram that provides an overview of the process of one embodiment of the present invention.

Referring to FIG. 4, a simple flowchart illustrating the automatic grouping of virtual circuits into virtual paths to assist in the network design process to optimize the network topology is illustrated. At step 100 a virtual circuit cost measure (VC_COST) is determined. The virtual circuit cost measure is derived from a metric for determining distances between nodes and a metric of virtual circuit consumption of link bandwidth. This unique measure is indicative of cost for each virtual circuit and derived from the unconstrained routing of the virtual circuit in the present topology. Preferably the virtual circuit cost measure is equal to the minimum information rate (MIR) multiplied by the minimum hop (MIN_HOP). The minimum information rate is a standard frame relay measure defined by both the CCITT and ANSI standards for packet switched networks. The minimum hop is defined to be the minimum number of nodes possible that are crossed in a point to point connection of a virtual circuit.

At step 110, the virtual circuits are merged into virtual paths. Preferably the process is initiated with the virtual circuits having the lowest cost, as determined in the previous step. The virtual circuits are grouped into virtual paths up to the maximum allowable number of virtual circuits for each virtual path and maximum number of virtual paths permitted per node until all possible virtual circuits are assigned to virtual paths. At step 120, if the number of virtual paths does not equal the maximum number of virtual paths possible at any node, the virtual path space is not exhausted. Therefore, the virtual paths are split into sub-paths with balanced virtual circuit loads. This process maximizes the routing and loading efficiency of the network by distributing the virtual circuits to even out the bandwidths of the virtual paths. Preferably, the loading efficiency is achieved by evenly distributing the number of virtual circuits among the virtual paths at each node.

Figure 5:
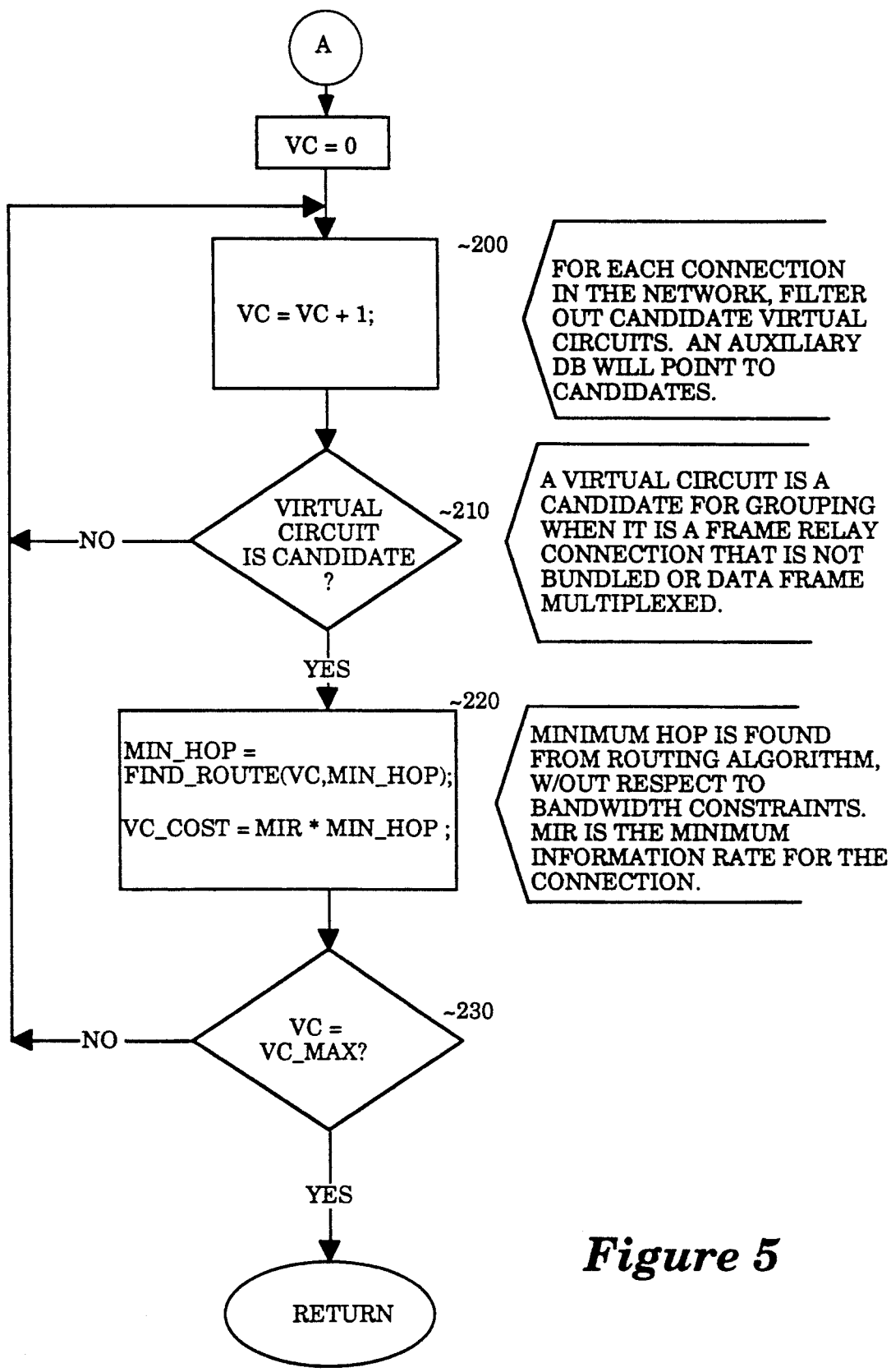
FIG. 5 illustrates the process for measuring the virtual circuit cost to the network.

FIG. 5 provides a more detailed description of the steps performed to measure the virtual circuit costs in the network. At steps 200 and 210 each virtual circuit is examined to determine if it is a candidate for grouping into a virtual path. Preferably a virtual connection is a candidate for grouping into a virtual path if it is a frame relay connection that is not bundled or data frame multiplexed onto a virtual path. Preferably an auxiliary database is maintained which is accessed to identify the virtual connections and whether a virtual circuit meets the qualifications for a candidate.

If a virtual circuit is determined to be a candidate, at step 220 the minimum hop and virtual circuit cost are determined. The minimum hop is determined from the network routing algorithm, without respect to bandwidth constraints and is defined to be the minimum number of connections or "hops" between an originating and destination node. For example, the minimum hop can be determined using a network routing routine:

$$MIN\_HOP = FIND\_ROUTE(CONN, MIN\_HOP),$$

where CONN identifies the virtual circuit, and MIN_HOP is a parameter that indicates that the route with the minimum hop is to be determined.

Once the minimum hop is determined, the connection cost for the virtual circuit can be computed. Preferably the cost of virtual circuit is determined as:

$$VC\_COST = MIR * MIN\_HOP$$

where MIR represents the minimum information rate for the virtual circuit. Preferably the MIR is user supplied according to network requirements. At step 230, a test is performed to determine if all virtual circuits have been examined. If all connections have not been examined, the process loops again through steps 200, 210, 220, 230 until all virtual circuits have been examined.

Figure 6:
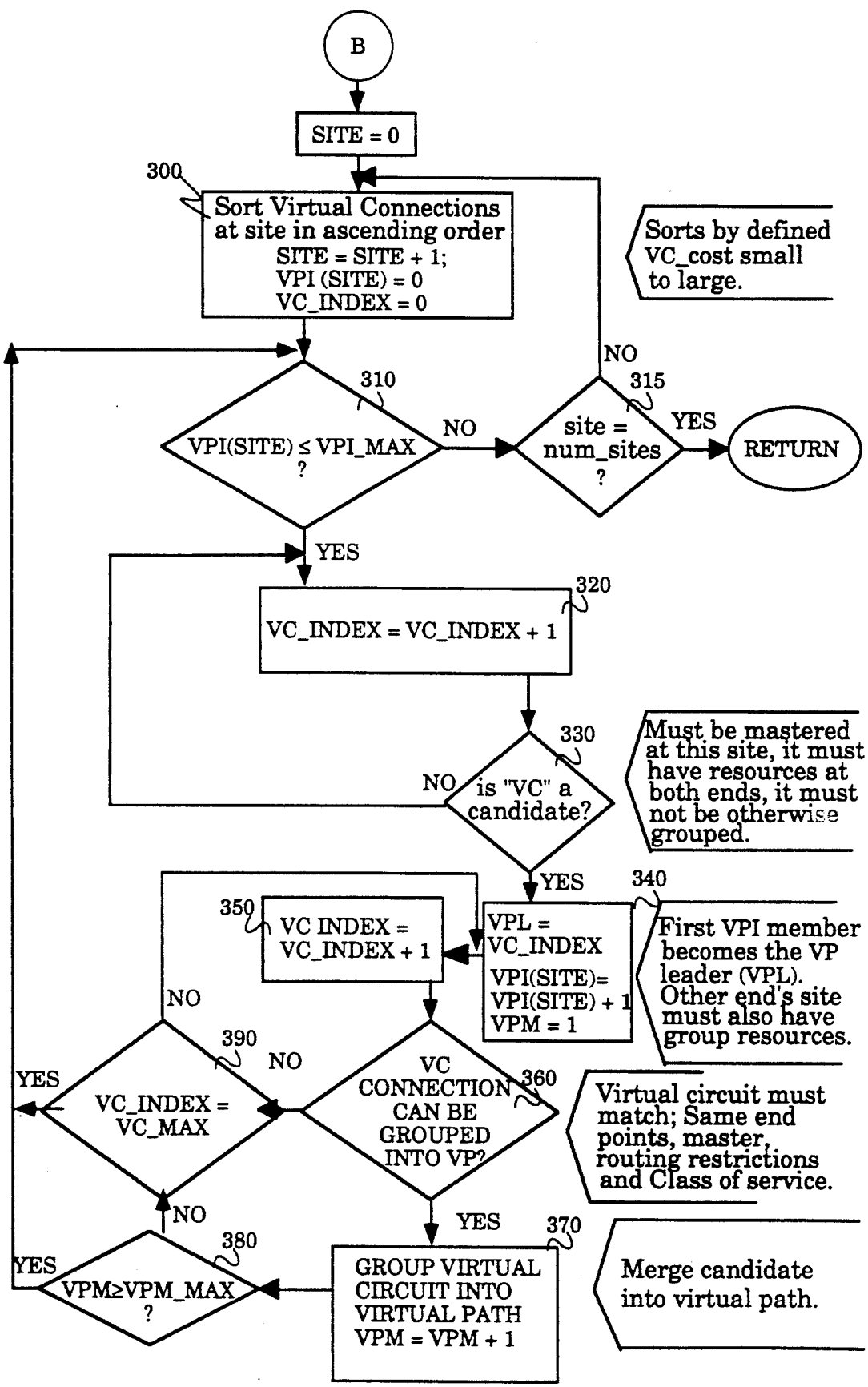
FIG. 6 is a flowchart that illustrates the process of merging virtual circuits into virtual paths.

FIG. 6 sets forth an exemplary algorithm for merging virtual circuits into virtual paths. At each site, the virtual circuits are first sorted in ascending order, according to the virtual circuit cost, step 300. A count of the number of virtual paths at the site (VPI (site)) is initialized to zero. A site may be defined as a node or an area which encompasses a plurality of nodes. In the present embodiment, each site consists of one node. At step 310, the site is examined to determine if the site has the ability to accommodate virtual paths, and starting at step 320, each virtual circuit at the site is examined. In the present illustration, VC_INDEX identifies the current virtual circuit (VC) being examined. Preferably the virtual circuits are examined in the order sorted.

At step 330, it is determined whether the current virtual connection is a candidate to be grouped onto a virtual path. A virtual circuit is a candidate if it is mastered at the site, has the resources available at both ends of the virtual circuit for a virtual path and is not already grouped into a virtual path. A node is considered "mastered" if it functions as a master device, e.g. initiating communications, with respect to other connected nodes. If the virtual circuit is a candidate, the first virtual circuit to be part of the virtual path becomes the group leader, step 340. The group leader is referred to and maintains the connection information and virtual circuit characteristics for the virtual path.

At step 350, the next virtual circuit is examined, and at step 360 it is determined whether this virtual circuit can be grouped into the same virtual path (VP). The criteria for determining whether the virtual circuit can be grouped is dependent on the network node criteria. For example, in order for the connection to be placed in the virtual path, the point to point connection of the virtual path leader must match, the virtual circuit must have the same routing restrictions and the same class of service. If the virtual circuit can be grouped into the virtual path, step 370, the virtual circuit is merged into the virtual path and the number of members (VPM) of the virtual path is increased by one. Furthermore, the virtual circuit's position is mapped onto the group to identify that the virtual circuit is associated with the virtual path. For example, adding an entry into the data structure defining the virtual path identifies the virtual circuit as a virtual path member. In addition, the aggregate bandwidth is generated and is placed onto the virtual path. Preferably, the aggregate bandwidth is maintained in a data structure associated with the virtual path.

At step 380, if the total number of virtual circuit members of a virtual path is equal to a maximum group member number(VPM_MAX), the virtual path is packed or full and a new virtual path is started by going back to step 310. The maximum group member number is determined according to the capacity of the network hardware. For example, a node may be able to accommodate up to 16 virtual circuits in a virtual path. If the number of members of the virtual path is not equal to the maximum group number, at step 390, the virtual circuit index (VC_INDEX) is compared to the maximum number of virtual connections (VC_MAX). If the virtual circuit index is equal to VC_MAX, then all virtual circuits have been examined for grouping in the present virtual path. Therefore, the process continues back at step 310, at which point the process is reinitiated with respect to the remaining virtual circuits to establish additional virtual paths if resources are available. At step 390, if all virtual circuits have not been examined, the process returns to step 350, where the next virtual circuit is examined to determined if it can be grouped with the present virtual path.

The process continues until all virtual circuits candidates are grouped into virtual paths or the number of virtual path resources for the site has been exhausted. This process is then performed for each site.

Figure 7:
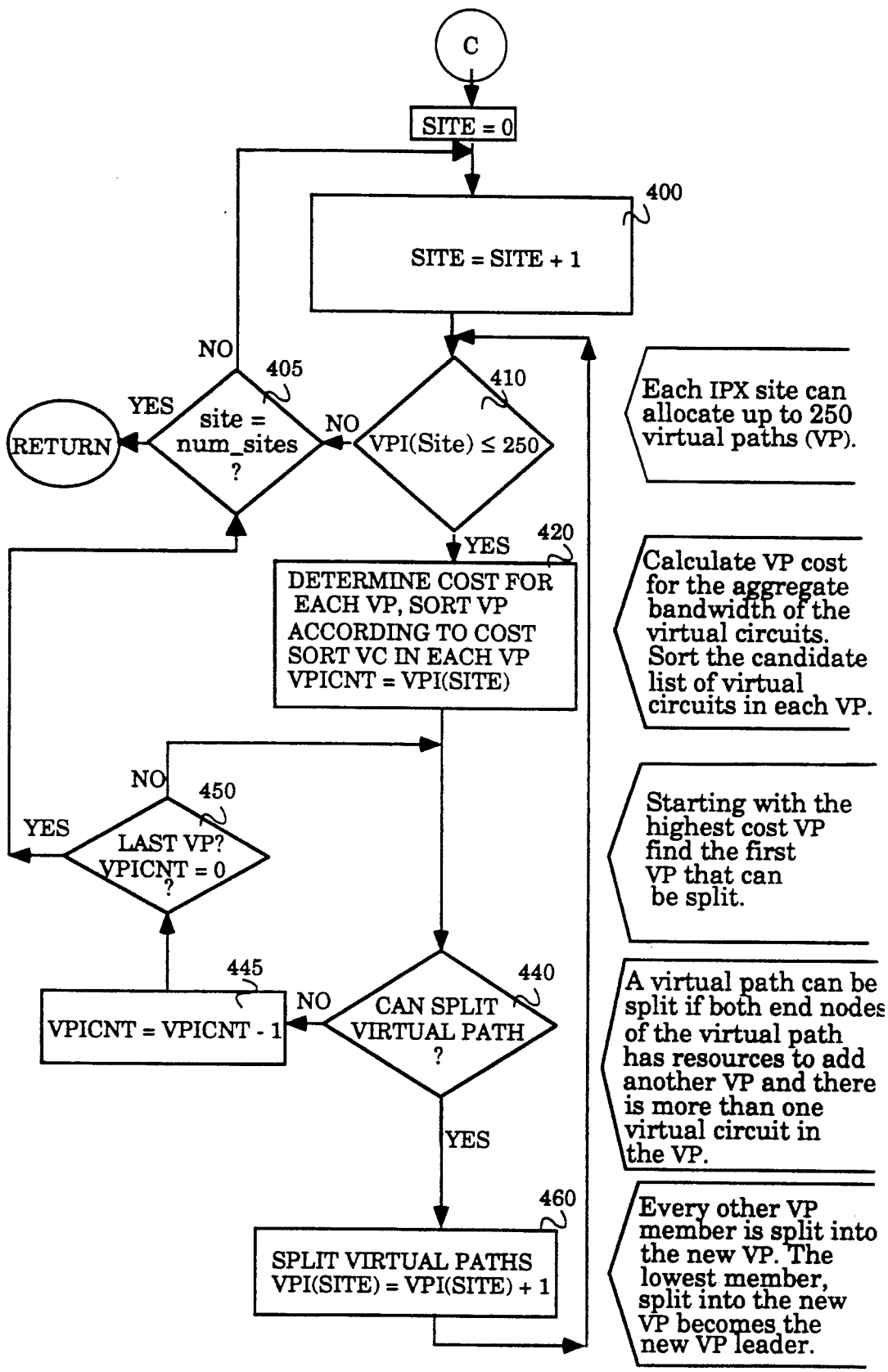
FIG. 7 is a flowchart that illustrates the process of splitting packed virtual paths to maximize the number of virtual paths.

FIG. 7 is a flowchart describing the process of splitting packed virtual paths into virtual paths having fewer members. At step 410 the first site is examined. If at step 410 the site has virtual path resources available, the virtual path costs for the aggregate bandwidth is computed. Preferably the virtual path costs is computed according to the following equation:

$$\text{VIRTUAL PATH\_COST} = \text{MIR} * \text{MIN\_HOP}$$

wherein MIR is the minimum information rate for the virtual path and min_hop is the minimum hop for the virtual path. The virtual paths are then sorted according to the virtual path cost. In addition, within each virtual path, the corresponding virtual circuits are sorted according to the corresponding virtual circuit cost computed.

The process of splitting the virtual paths is started with the virtual path having the highest cost. First, it is determined if the virtual path can be split into two virtual paths, step 440. A group can be split if both end nodes of the virtual path have the resources to add another virtual path and there is more than one virtual circuit in the virtual path to be split. If the virtual path cannot be split and all virtual paths have been examined, step 450, the process flow continues with the virtual paths at the next site, step 400, 405 and continues until virtual paths at all sites have been examined.

If at step 440 the virtual path can be split, then the virtual circuits of the virtual path is split into two virtual paths. Preferably the virtual path is split evenly between the two virtual paths to spread out resource usage. For example, the virtual path can be split by taking every other virtual circuit of the virtual path and placing it in the new virtual path. As the virtual circuits are in sorted order according to the cost measure, this resultant effect is an even distribution of resources between the two virtual paths. Preferably, the member having the lowest cost which is placed into the new virtual path becomes the virtual path leader for that new virtual path, step 460.

Once the virtual path is split into two virtual paths, the process is reinitiated for the site beginning at step 410. The virtual path costs are recomputed and the virtual paths are resorted, step 420, the highest cost virtual path is examined and split if possible, steps 440, 460 for the site, until the virtual path resources for the site have been exhausted or all virtual paths which can be split have been split. As noted above, the process further continues for each site until all virtual paths at all sites have been processed.

It can therefore be determined that the inefficiencies that are realized by grouping virtual circuits, such as limited routing opportunities due to large bandwidth limitations, are minimized by maximizing the number of virtual paths utilized at each site. For example, by dividing a virtual path into two virtual paths, the total bandwidth cost of each virtual path is decreased, thereby simplifying the routing process during usage of the network.

Although the present invention has been described in terms of the preferred embodiment, it will be appreciated that various modifications and alterations may be made by those skilled in the art without departing from the spirit and scope of the invention as set forth in the appended claims. The specification and drawings are, accordingly, to be regarded in an illustrative rather than a restrictive sense.

What is claimed is:

1. A method for designing a telecommunications network topology comprising at least one site, each site comprising a number of nodes and virtual circuits between nodes, each node comprising resources for accommodating a predetermined number of virtual circuits and a predetermined number of virtual path connections, each virtual path comprising a predetermined number of virtual circuits, said method comprising the steps of:

configuring an initial network topology;
optimizing the network topology by utilizing the virtual path resources at the nodes comprising the steps of;
grouping virtual circuits at each node into virtual paths for routing comprising a step of merging virtual circuits at each node which have common characteristics including common node points into virtual paths, and
if the number of virtual paths at a node does not exceed the predetermined number of virtual paths at the node, splitting at least one virtual path at the node into two new virtual paths until the predetermined number of virtual paths at the node is reached, to maximize resource usage and efficiency;
wherein the network topology incorporating virtual paths is optimized.

2. The method as set forth in claim 1, wherein the step for merging virtual circuit comprises the steps of:
determining a cost measure for each virtual circuit between nodes;
sorting the virtual circuits by the cost measure;
examining each virtual circuit in sorted order; and
merging the virtual circuit into a virtual path as a virtual path member if the maximum number of virtual path members has not been reached and if the virtual circuit has the same characteristics as other virtual path members.

3. The method as set forth in claim 2, wherein the cost measure is determined according to a measure of consumption of a link bandwidth between nodes and a minimum routing between nodes.

4. The method as set forth in claim 3, wherein the measure of consumption of link bandwidth between nodes is determined according to a minimum information rate for the node.

5. The measure as set forth in claim 3, wherein the minimum routing between nodes is determined according to a minimum hop.

6. The method as set forth in claim 2, wherein the step for determining the cost measure for each virtual circuit between nodes comprises the step of computing the cost measure according to the following equation:

$$\text{VIRTUAL CIRCUIT\_COST} = \text{MIR} * \text{MIN\_HOP}$$

wherein VIRTUAL CIRCUIT_COST represents the cost measure, MIR represents the minimum information rate has the network and MIN_HOP represents the minimum hop for the virtual circuit for the network topology.

7. The method as set forth in claim 2, wherein if a virtual circuit does not have the same characteristics as other virtual path members, said method further comprises the step of establishing an additional virtual path if the predetermined number of virtual paths for a node has not been exceeded, said virtual path having the characteristics of the virtual circuit, such that the virtual circuit becomes the leader for the virtual path.

8. The method as set forth in claim 2, wherein the step of splitting comprises the steps of:
determining if a virtual path can be split by determining if both end nodes of the virtual path have not exceeded the predetermined number of virtual paths specified for a node and there is more than one virtual circuit in the virtual path;
if the virtual path can be split, moving a portion of the virtual circuits to a new virtual path.

9. The method as set forth in claim 8, wherein alternate virtual path members are moved into a new virtual path.

10. The method as set forth in claim 9, wherein the virtual circuit having a lowest cost measure becomes a virtual path leader for the new virtual path.

11. The method as set forth in claim 8, further comprising the step of sorting the virtual paths according to a virtual paths cost measure and examining each virtual path in sorted order to determine if the virtual path can be split.

12. The method as set forth in claim 11, wherein the virtual path cost measure is determined according to the minimum number of hops to route the virtual path and bandwidth utilization.

13. The method as set forth in claim 8, wherein the step of splitting is continued until the resources at the node are exhausted or until all possible virtual paths have been split.

14. The method as set forth in claim 1, wherein a site comprises a plurality of nodes, and steps of grouping virtual circuits and splitting virtual paths are performed on a site by site basis.

15. A method for designing a telecommunications network topology comprising multiple sites and virtual circuits between sites, each site comprising a number of nodes, each node comprising resources for accommodating a predetermined number of virtual circuits and a predetermined number of virtual path connections, each virtual path comprising a predetermined number of virtual circuits, said method comprising the steps of:

(a) configuring an initial network topology;
(b) optimizing the network topology by utilizing the virtual path resources at the nodes comprising the steps of:
grouping the virtual circuits at each node into virtual paths for routing comprising the steps of;
determining a cost measure for each virtual circuit between nodes, and
merging virtual circuits at each node which have common characteristics including common node points into virtual paths, and if the number of virtual paths at a node does not exceed the predetermined number of virtual paths at the node, splitting at least one virtual path at the node into two new virtual paths until the predetermined number of virtual paths at the node is reached, to maximize resource usage and efficiency;

(c) determining a network cost for the topology;

(d) configuring an alternate topology based on the network cost;

(e) repeating steps (b), (c) and (d) until the network cost is minimized; wherein the network topology incorporating virtual paths is optimized.

16. A telecommunications network designed to incur minimum costs comprising at least one site comprising a plurality of nodes and virtual circuits between nodes, said network comprising at least one virtual path between nodes, each virtual path comprising a plurality of virtual circuits having like characteristics, the characteristics of the virtual path specified according to the characteristics of the virtual circuit which is a virtual path leader for the virtual path, each node accommodating a maximum number of virtual paths, the number of virtual paths and characteristics of virtual paths specified by merging virtual circuits at each node which have common characteristics including common node points into virtual paths, said virtual circuits merged in order of a cost measure determined for each virtual circuit, and splitting at least one virtual path at the node into two new virtual paths until the maximum number of virtual paths at the node is reached, to distribute resource usage and maximize efficiency.

17. The telecommunications network as set forth in claim 16 wherein the virtual circuit having a lowest cost measure in each new virtual path formed by splitting virtual paths is identified as the virtual path leader for the new virtual path.

* * * * *